(12) United States Patent
Chen (10) Patent No.: US 8,691,478 B2
(45) Date of Patent: Apr. 8, 2014

(54) ATTENUATED PHASE SHIFT MASK FOR MULTI-PATTERNING

(75) Inventor: Frederick T. Chen, Hsinchu County (TW)

(73) Assignee: Industrial Technology Research Institute, Hsinchu (TW)

( * ) Notice: Subject to any disclaimer, the term of this patent is extended or adjusted under 35 U.S.C. 154(b) by 12 days.

(21) Appl. No.: 13/607,823

(22) Filed: Sep. 10, 2012

(65) Prior Publication Data

US 2014/0072902 A1 Mar. 13, 2014

(51) Int. Cl.
*G03F 1/32* (2012.01)

(52) U.S. Cl.
USPC .................................................. 430/5

(58) Field of Classification Search
USPC ...................... 430/5, 322, 323, 394
See application file for complete search history.

(56) References Cited

U.S. PATENT DOCUMENTS

| | | | |
|---|---|---|---|
| 6,190,086 B1 | 2/2001 | Mueller et al. | |
| 6,301,698 B1 | 10/2001 | Lin et al. | |
| 6,630,408 B1 | 10/2003 | Tzu et al. | |
| 6,632,741 B1 | 10/2003 | Clevenger et al. | |
| 7,291,425 B2 | 11/2007 | Dulman | |
| 7,556,891 B2 | 7/2009 | Tan et al. | |
| 7,582,396 B2 | 9/2009 | Lin | |
| 2005/0214652 A1* | 9/2005 | Vernon et al. | 430/5 |
| 2008/0145771 A1 | 6/2008 | Yoon et al. | |

FOREIGN PATENT DOCUMENTS

| | | |
|---|---|---|
| TW | 200419301 | 10/2004 |
| TW | 200844646 | 11/2008 |
| WO | 9947981 | 9/1999 |

OTHER PUBLICATIONS

Kachwala et al., "Imaging contrast improvement for 160nm line features using sub resolution assist features with binary, 6% ternary attenuated phase shift mask with process tuned resist", Optical Microlithography XII, 1999, pp. 55~67, vol. 3679.
Iwasaki et al., "High transmittance rim-type attenuated phase-shift masks for sub-0.2um hole patterns", Photomask and X-Ray Mask Technology V, Apr., 1998, pp. 601~608, vol. 3412.
Ma et al., "Preventing sidelobe printing in applying attenuated phase-shift reticles", Optical Microlithography XI, 1998, pp. 543-552, vol. 3334.
Burn J. Lin, "The Attenuated Phase-Shifting Mask", Solid State Technology, Jan. 1992, pp. 43~47, vol. 35, No. 1.
Ahn et al., "A study of optical proximity effects using off-axis illumination with attenuated phase shift mask", Optical/Laser Microlithography VIII, May 26, 1995, pp. 222~239, vol. 2440.
Lowes et al., "Advantages of BARC and photoresist matching for 193-nm photosensitive BARC applications", Advances in Resist Materials and Processing Technology XXVII, 2010, pp. 1~11, vol. 7639.

* cited by examiner

*Primary Examiner* — Stephen Rosasco
(74) *Attorney, Agent, or Firm* — Jianq Chyun IP Office (57) ABSTRACT

An attenuated phase shift mask (AttPSM) is fabricated with a set of fully transmitting regions, some parts adjacent phase-shifting regions with a first reduced transmission and first phase shift near 180 degrees, and remaining parts adjacent phase-shifting regions with a second transmission higher than the first transmission and second phase shift lower than the first phase shift.

20 Claims, 14 Drawing Sheets

FIG. 4A    FIG. 4B

# ATTENUATED PHASE SHIFT MASK FOR MULTI-PATTERNING

TECHNICAL FIELD

The present disclosure generally relates to an attenuated phase shift mask for multi-patterning, a lithography technique.

BACKGROUND

Related Art

Lithography beyond the 40 nm half-pitch node faces numerous challenges. The challenges are associated with the use of photoresists to define sub-40 nm features, including line-edge roughness, shot noise, acid diffusion blur, and resist collapse. The use of ionizing radiation such as extreme ultraviolet (EUV) radiation, X-rays, ion beams or electron beams pose additional concerns such as secondary electron migration, surface charging and contamination. Most significantly, these alternative technologies are not ready due to high cost and low throughput.

Double patterning has therefore emerged as the solution for lithography down to the 20 nm node. However, under the current situation, beyond 20 nm, quadruple patterning may be needed down to the 10 nm node, and octuple patterning down to 5 nm node. These multiple patterning (aka "multi-patterning") methods may require multiple direct exposure methods, but this would pose large challenges for pattern placement and overlay. More commonly, double patterned features may be formed using sidewall spacers, especially for the regularly placed features of memory devices. Quadruple and octuple patterning may follow by various iterations of this approach. An inconvenient consequence of using sidewall spacers is the formation of loops which must have the ends removed to form separate lines. Conventionally, since this must be performed with a separate exposure, which adds cost and lowers overall throughput, it would be preferable to have the loops already broken when the spacers are patterned.

For the 65 nm node and beyond, attenuated phase shift masks are most commonly used, with straight edges being defined by the boundaries between fully transmitting regions, and adjacent thin-film regions which shift the light phase by 180 degrees and at the same time attenuate the intensity. By reducing the thin film thickness in the areas where the spacer material is to be removed so that the loops are broken, the phase shift is reduced, and at the same time, more light is transmitted, allowing the edge contrast to be degraded sufficiently to form sloped edges in the photoresist.

Therefore, it is proposed to fabricate an attenuated phase shift mask with features that allow the patterning of well-defined and straight edges where the sidewall spacers are to be formed, but at the same time the sidewall spacers may be removed to separate lines or to make cuts without an additional exposure.

SUMMARY

Accordingly, the present disclosure is directed to an attenuated phase shift mask for a multi-patterning process involving sidewall spacers.

The present disclosure directs to an attenuated phase shift mask having elements including a substrate and a layer attached to the substrate for reducing transmission and imparting a phase shift to light transmitted through the layer. The layer has a first etched region imparting a first phase shift and a first transmission, a second etched region imparting a second phase shift and a second transmission, and a clear region adjacent to the first etched region in one border and adjacent to the second etched region in another. The first transmission is higher than the second transmission and the first phase shift is lower than the second phase shift.

The present disclosure directs to an attenuated phase shift mask having elements including a substrate and a layer attached to the substrate for reducing transmission and imparting a phase shift to light transmitted through the layer. The layer has a first etched region imparting a first phase shift and a first transmission, a second etched region imparting a second phase shift and a second transmission, and an unetched region imparting a third phase shift and a third transmission, and a clear region adjacent to the unetched region and the first etched region or the second etched region. The first transmission and the second transmission are both greater than the third transmission, and the first phase shift and the second shift are both less than the third phase shift.

The accompanying drawings are included to provide a further understanding of the disclosure and are incorporated in and constitute a part of this specification. The drawings illustrate embodiments of the disclosure and, together with the description, serve to explain the principles of the disclosure.

DETAILED DESCRIPTION OF DISCLOSED EMBODIMENTS

Reference will now be made in detail to the present embodiments of the disclosure, examples of which are illustrated in the accompanying drawings. Wherever possible, the same reference numbers are used in the drawings and the description to refer to the same or like parts.

An attenuated phase shift mask is typically used to define trenches or openings in a layer on a semiconductor substrate. On the photomask these features correspond to clear and full transmitting openings in a thin film layer which attenuates light intensity and also shifts the light phase by 180 degrees relative to the fully transmitted light. The 180 degree phase shift sharpens the edge definition of these features.

The edges of the features patterned by an attenuated phase shift mask tend to be high contrast and so that the walls can be formed very straight. When spacers are formed on the sidewall by anisotropic etching, the spacers surround the trench edges all around and forming a loop from a top view. However, it may be desired in double patterning to remove two unused ends of the loop, leaving two parallel spacer-lined edges.

In order to removed unwanted sidewall spacers, an attenuated phase shift mask from which sloped edges may be developed could be implemented to form more sloped edges where sidewall spacers may not be supported due to their eventual removal by the same anisotropic etching.

This present disclosure provides an attenuated phase shift mask which could under a single exposure provide the combination of fine spacer definition with loop breaking, and thus at least one extra exposure process is saved. The photomask is also compatible with multiple patterning, not just double patterning.

Figure 1A:
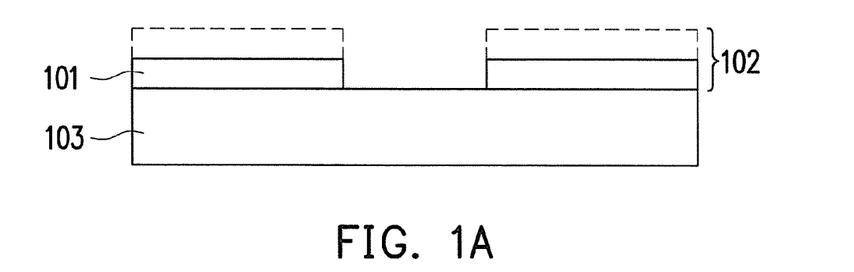
FIG. 1A illustrates an attenuated phase shift with phase shift layers etched to half thickness to avoid destructive interference and to provide a sloped edge profile.
Figure 1B:
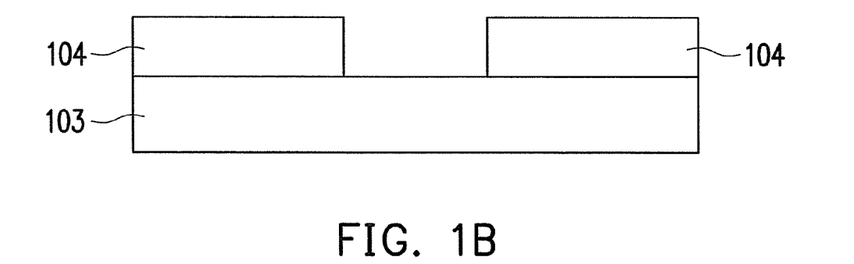
FIG. 1B-1D illustrates a first, a second, and a third type of attenuated phase shift mask.
Figure 1C:
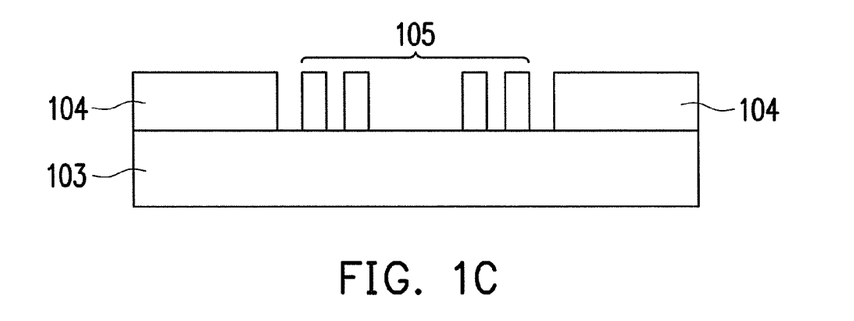
Figure 1D:
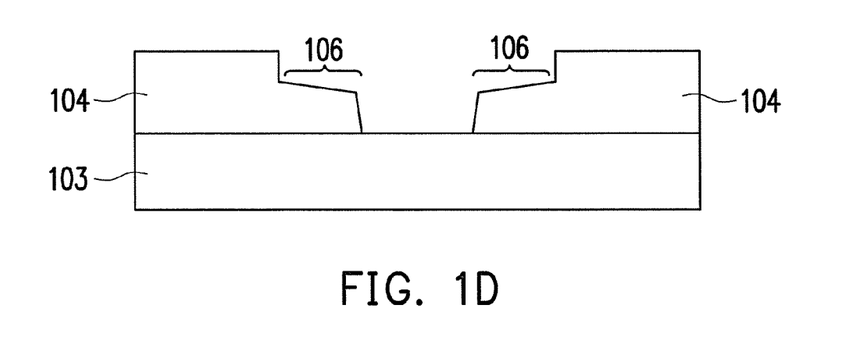
Figure 1E:
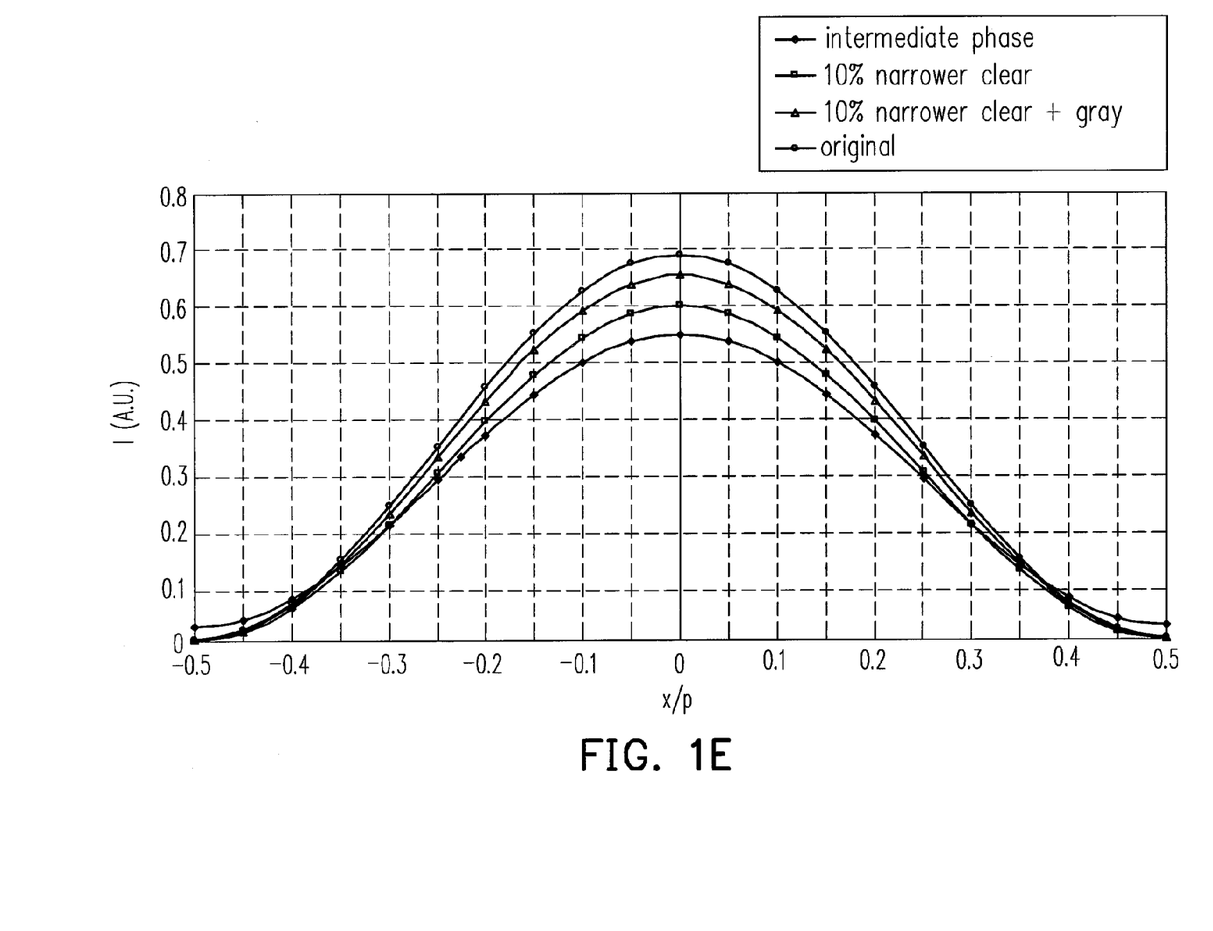
FIG. 1E is a graph showing the aerial images of the different attenuated phase shift masks.
Figure 1F:
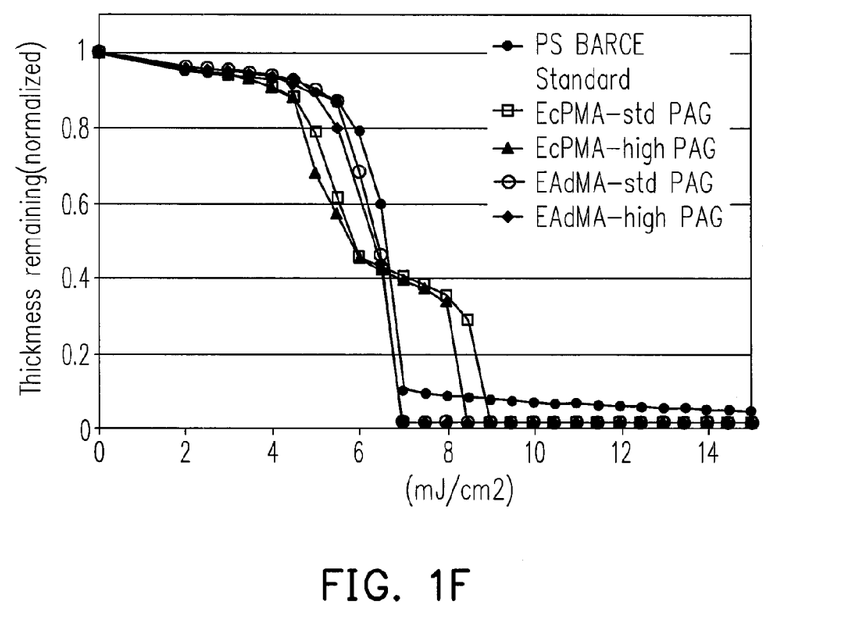
FIG. 1F shows the resist thickness as a function of dose in a particular case.
Figure 1G:
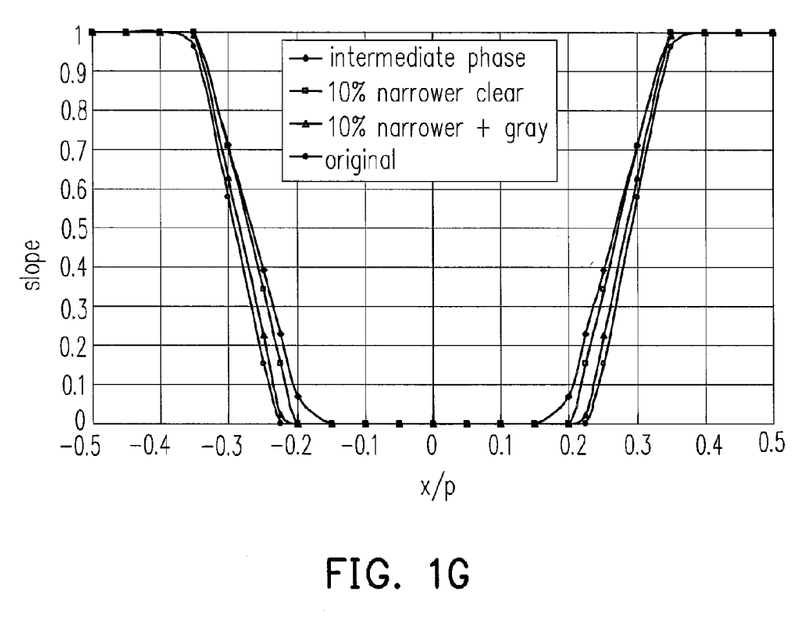
FIG. 1G shows the resist profiles resulting from the aeriel images of FIG. 1E.
Figure 1H:
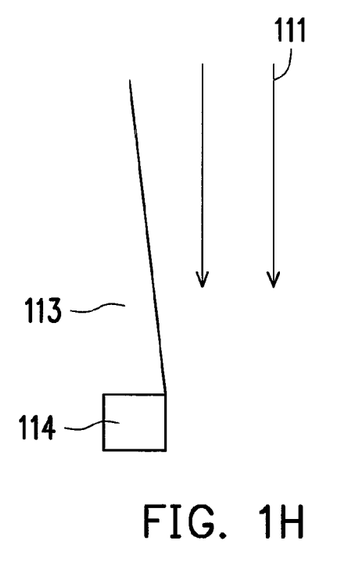
FIG. 1H-1K illustrates effect of etching of photoresist of different profiles.
Figure 1I:
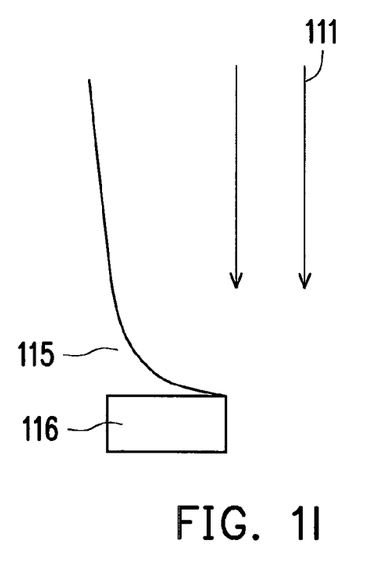
Figure 1J:
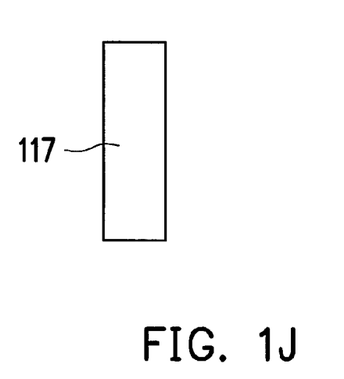
Figure 1K:
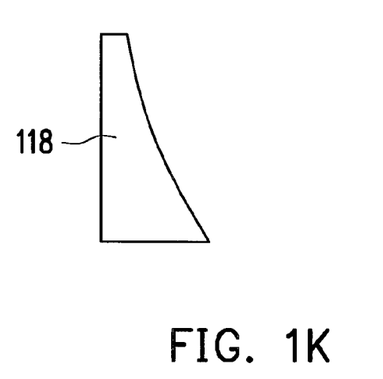
Figure 1L:
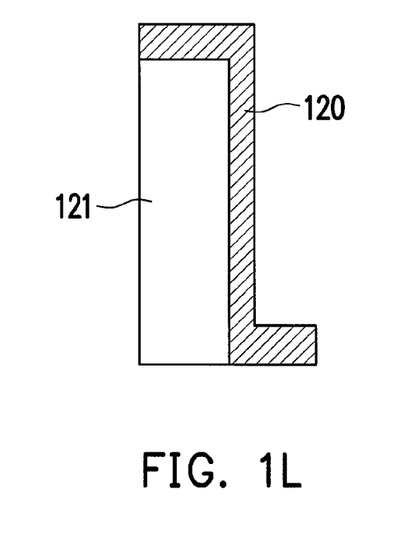
FIG. 1L-1O illustrates the effect of anisotropic etching on the spacer.
Figure 1M:
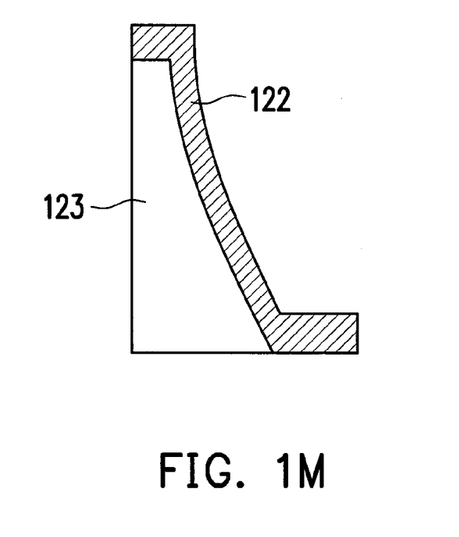
Figure 1N:
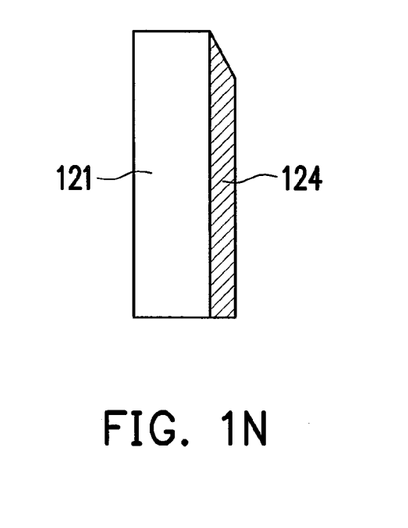
Figure 1O:
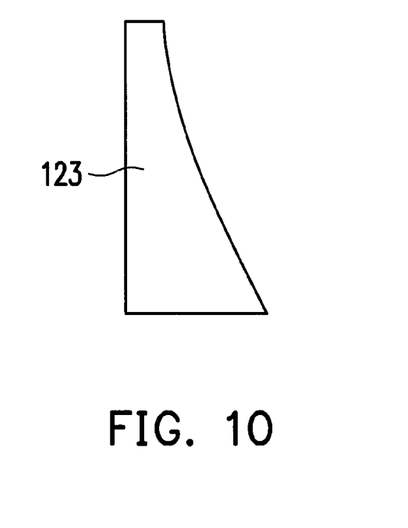
Figure 1P:
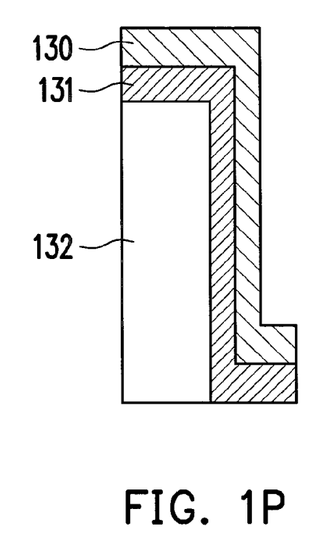
FIG. 1P-1S illustrates the effect of forming a spacer gap.
Figure 1Q:
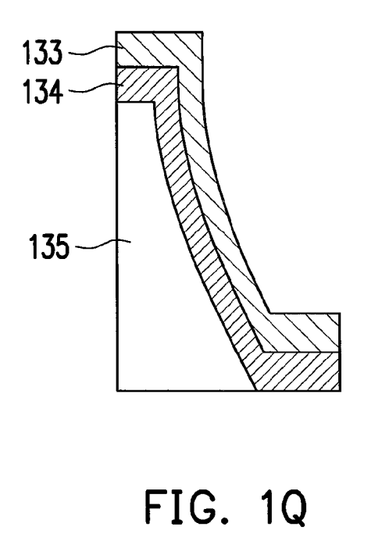
Figure 1R:
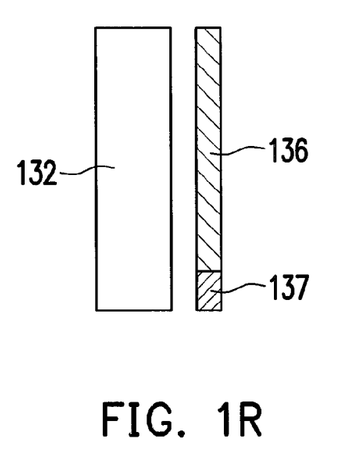
Figure 1S:
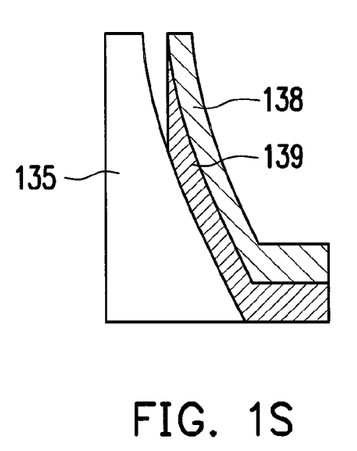
Figure 1T:
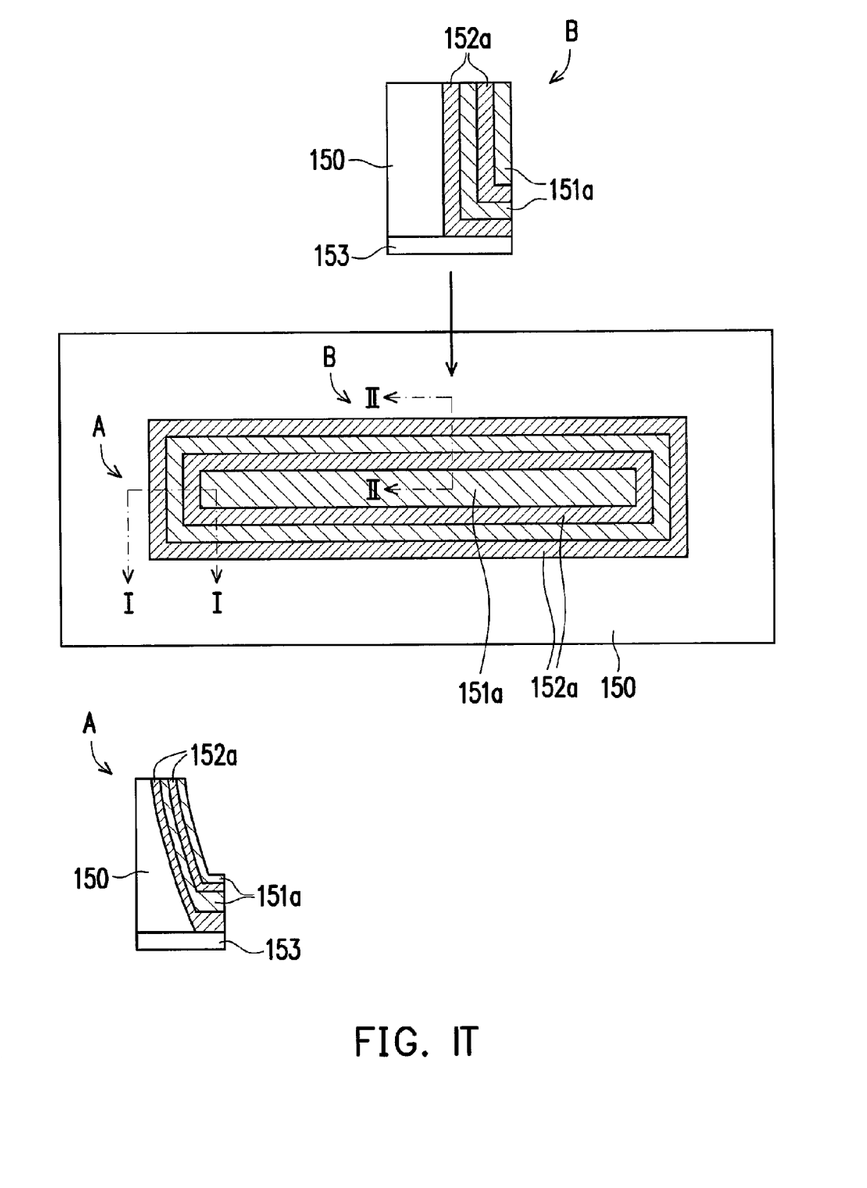
FIG. 1T illustrates the quadruple patterning process before etching.
Figure 1U:
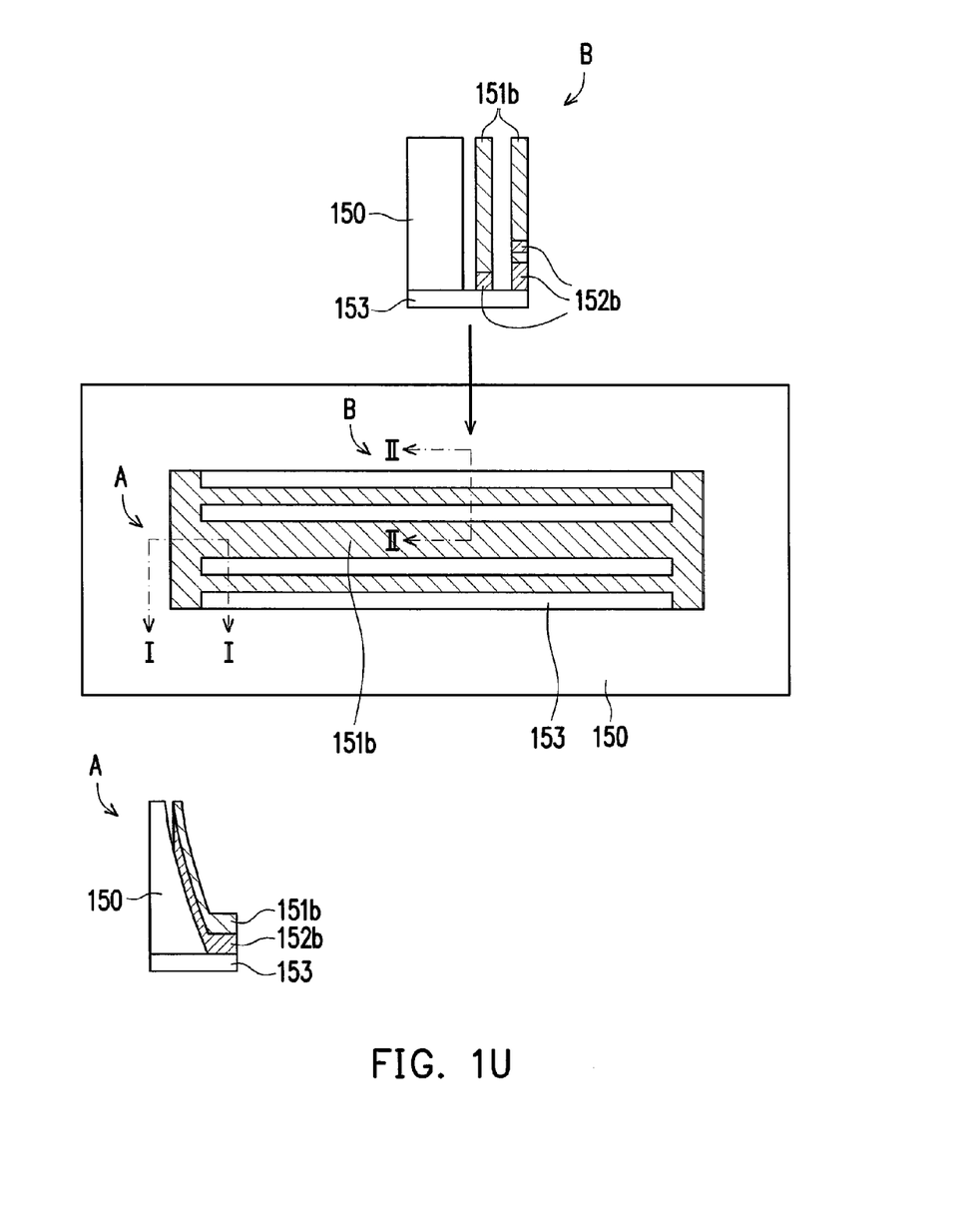
FIG. 1U illustrates the quadruple patterning process after etching.

FIG. 1A-1U contain illustrations for the concept upon which the present disclosure is premised in accordance with the present disclosure.

The term "attenuated phase shift mask" in this present disclosure would sometimes be referred to as simply the "photomask", and these two terms would be used interchangeably.

FIG. 1A illustrates an exemplary attenuated phase shift mask for the purpose of illustrating the concept behind the present disclosure. The photomask contains a substrate 103 with a phase shift layer 101 etched to half thickness to impart a 90 degrees phase shift, which suppresses complete destructive interference and therefore provides a sloped edge profile. The substrate 103 is assumed to be transparent as the incident light going through the substrate is fully transmitting and does not experience any phase shift. If the phase shift layer were completely un-etched, it may have an unetched height 102 which imparts a 180 degrees phase shift and a transmission in the range of 6%-33%, for example, for the incident light. The 180 degrees phase shift and 6%-33% transmission result in complete destructive interference at the feature edges which provides a perpendicular edge profile and is subsequently referred to as having a "standard" phase shift or "standard" rate of transmission.

However, the phase shift layer could be etched to avoid destructive interferences in order to produce a more sloped edge profile. By etching the phase shift layer to half thickness, the phase shift imparted by the layer is reduced from 180 degrees to 90 degrees as the relationship between the thickness of the layer and the phase shift imparted is linear. Also with thickness etched to half, the transmission is increased from, for example, 6% to 24.5% as the relationship between the thickness of the layer and the rate of transmission is inversely exponential.

Typical phase shift layer films which could be used are MoSi, MoSiN, MoSiO, MoSiON, CrF, ZrN, and TiSiN. A bi-layer may also be used to separately control transmission and phase, but is not preferred, as a smaller relative portion of the complete phase-shift film stack is needed to be etched for the desired partial phase shift.

FIG. 1B-1C illustrates two constructed attenuated phase shift masks. For the first photomask of FIG. 1B, it contains a transparent substrate 103 and an unetched phase shift layer 104 situated on two sides of the substrate. The phase shift layers shift the phase of the incident light by 180 degrees and reduce the transmission to 6% typically. The photomask contains a clear region which is the central region not covered by the phase shift layer. The photomask develops a pattern with a good (perpendicular) edge profile corresponding to the edge of the phase shift layer as the result of the 180 degrees destructive interference with the incident light.

FIG. 1C illustrates a second type of attenuated phase shift mask. The photomask contains a substrate 103, an unetched phase shift layer 104, and "gray" area formed from sub-resolution features 105. The substrate 103 is fully transparent. The phase shift layer 104 imparts the standard 180 degree phase shift and reduces the transmission to 6%. The sub-resolution features 105 are tiny features which are too small to result in discernable patterns but are meant to blur the incident light for the purpose of producing an edge profile which may be somewhat sloped.

FIG. 1D discloses a preferable formulation of attenuated phase shift mask. The photomask contains a substrate 103, an unetched phase shift layer 104 which provides the standard 180 degrees phase shift and most commonly a 6% transmission for the incident light. The photomask however contains an intermediate phase layer 106 as an alternative "gray area" for the purpose of producing an edge profile which may be somewhat sloped. This intermediate phase layer is naturally achieved by etching the phase shift layer 104 to a partial extent, leaving an unetched portion that provides less than 180 degrees phase shift and greater than 6% transmission.

FIG. 1E shows aerial images corresponding to three types of masks mentioned above. The x-axis is distance normalized to a pitch (x/p), and the y-axis is the light intensity on a wafer. The third type corresponding to 1D ("intermediate phase") demonstrates the least destructive interference by exhibiting a larger minimum intensity level. Also, the peak intensity of the incident light going through 1D is lower compared to the other two types corresponding to photomask 1B and 1C. as well. The effect of exhibiting a lower peak intensity level is even more pronounced when the width of the clear region is narrowed, as less light is let through to pass through the optics to the wafer. FIG. 1F is a graph showing an example of the measured resist thickness as a function of incident exposure dose. By varying the intensity of the incident light received by the photoresist situated on a wafer, the thickness of the resist can be varied after etching. According to FIG. 1F, the critical region for the incident dose on the photoresist is between 6 to 9 milli-joules per square centimeter as change of resist thickness is most sensitive to the change of the incident light intensity.

FIG. 1G is a graph which illustrates the result of using the three different photomasks of FIGS. 1B, 1C, and 1D to produce resist profile effects. The graph of FIG. 1G shows slopes of the three different resist thickness profiles in y-axis with respect to distance which is normalized to a pitch (x/p) as the x-axis. The photomask of FIG. 1B produces photoresist profiles with a somewhat perpendicular edge as expected. Surprisingly the profile produced by the photomask of FIG. 1C also does not deviate much from that of FIG. 1B, because the gray area does not change the phase shift. However, FIG. 1D with an intermediate etched phase-shift layer produces a sloped profile with an almost horizontal and rounding curvature at the foot of the slope. The effect of a sloped profile with an almost horizontal and rounding curvature at the foot of the slope is even more pronounced when the clear region is of narrower width.

FIGS. 1H-1K illustrates the effect of an anisotropic etch process to transfer a sloped photoresist profile pattern to an underlying layer. FIG. 1H shows the effect of etch transfer for the photoresist with a somewhat perpendicular edge profile. FIG. 1I shows the etch transfer characteristics for the sloped photoresist with an almost horizontal and rounding curvature at the foot of the slope. Comparing FIG. 1H and FIG. 1I, two different patterns as illustrated in FIGS. 1J and 1K are produced after the etch transfer. Both these patterns may result by use of the same photomask, simply by including or not including the intermediate phase layer.

For more detail, FIG. 1H may contain a photoresist layer 113 with a film of underlying material 114. The underlying material 114 could be but not limited to silicon dioxide or silicon nitride. The photoresist layer 113 and the underlying material 114 of FIG. 1H is to be etched by an etchant 111 with a selectivity greater than 5:1. Similarly, the photoresist 115 and the spacer material 116 of FIG. 1I is to be etched with the same selectivity. 5:1 selectivity means that the layer 114 under the photoresist 113 is etched 5 times faster than the photoresist 114 as every nanometer of the photoresist removed vertically occurs at the same time as 5 nanometers of underlying layer is etched vertically. For the pattern of FIG. 1H, after the etch transfer the underlying sidewall slope 117 as shown in FIG. 1J would be very close to vertical; whereas for the pattern of FIG. 1I, after the etch transfer the underlying sidewall slope 118 as shown in FIG. 1K would be far from vertical since the foot of the photoresist 115 is very close to horizontal. Therefore, the result of the etch transfer for the pattern of FIG. 1H would produce a vertical sidewall as in FIG. 1J, but the result of the etch transfer for the pattern of FIG. 1I which contains a horizontal photoresist pattern at the foot of the photoresist would produce a more sloped sidewall pattern as in FIG. 1K.

FIG. 1L-1O illustrates the effect of anisotropic etching on the spacer mask. A comparison is to be made between FIG. 1L and FIG. 1M. FIG. 1L shows a spacer support pattern 121 based on the pattern 117 of FIG. 1J. FIG. 1M shows a spacer support pattern 123 based on the pattern 118 of FIG. 1K which is produced by a photomask with an intermediate phase layer such as the one in FIG. 1D. The spacer material 121 and 123 here could be but not limited to silicon dioxide or silicon nitride. As FIG. 1L is deposited with a film of spacer material 120 (e.g. silicon nitride or silicon dioxide) different from the support pattern material 121, the effect of the controlled anisotropic etching could produce a pattern of FIG. 1N if the etch is timed so that the horizontal portion is etched away while the vertical sidewall portion is allowed to remain. The result according to FIG. 1N is, for example, a vertical SiO2 121 pattern standing next to a vertical Si3N4 124 sidewall. The standing support pattern may be removed afterwards to allow the spacer to act as an etch mask.

FIG. 1O shows the result of the anisotropic etching on the pattern of FIG. 1M. For FIG. 1M, a film of the spacer material 122 is deposited onto the support pattern material 123. In this case, under the same conditions producing FIG. 1N, even the spacer material 122 on the sloped pattern 123 are allowed to etched away so that only the pattern 123 would remain. The significance of FIG. 1L-1O is to show that in regions of a wafer where the sloped pattern is formed, the deposited film of spacer material on a slope would be etched away but the deposited film of spacer on a vertical wall would remain. In this way, undesired portions of the spacer-defined pattern, e.g., the ends of a spacer loop, could be removed if the spacer is deposited on a slope instead of a vertical wall. The sloped pattern 123 as in FIG. 1O could be produced by a photomask with an intermediate film such as the one in FIG. 1D.

FIG. 1P-1S illustrates the effect of vertical walls or slopes on the formation of a spacer gap or a trench. FIG. 1P shows a first film 130 and a second film 131 of side wall spacer materials deposited on a previously defined support pattern 132 such as the one shown in pattern 117 of FIG. 1J. The pattern 132 could be a SiO2 pattern with a straight edge. The first film 131 could be silicon nitride. The second film 130 could be the same material as the one used for the pattern 132 as long as it is different from the material used for the first film 131.

FIG. 1R illustrates the remainder of the first film 137, the second film 136, and the support pattern 132 with a straight edge after an anisotropic etch has been applied which selectively removes the first spacer film 137. Under this scenario, the first spacer film 131 of FIG. 1P is completely removed except for the remnant which was not etched because of the shielding of the second spacer film 136 which functions as an etch mask. After etching is completed, a trench is formed between the support pattern 132 and the remainder of the first 137 and second 136 spacer film and the remains of the first 137 and second film 136 becomes a standing column. Subsequent etching can remove underlying layers not covered by the support pattern 132 and the remaining pattern of 136 and 137.

FIGS. 1Q and 1S illustrates a different outcome for the pattern 135 with a sloped edge profile developed by the photomask with an intermediate phase layer, and the sloped pattern 135 here is the same pattern as 118 in FIG. 1K. Similar to FIG. 1P, the first spacer film 134 is first deposited on the previously developed spacer pattern 135, and then the second spacer film 133 is deposited on top of the first spacer film. The pattern 135 could be a SiO2 pattern with a sloped edge. The first film 134 could be made of silicon nitride. The second film 133 could be the same material as the one used for the pattern 135 as long as the material used for the first film 134 is different from the material used for the second film 133.

FIG. 1S illustrates the remainder of the first film 139, the second film 138, and the pattern underneath 135 with a sloped edge after an anisotropic etch has been applied which is selectively removes the first spacer film 139. In this scenario, only the uncovered portion of first spacer film 139 of FIG. 1Q is removed since the remnant of the first film 139 is shielded by the second spacer film 138 which functions as an etch mask. After etching is completed, a shallow gap is formed between the pattern 135 and the remains of the first 139 and second 138 spacer film. Since this gap does not penetrate all the way to the layer underneath 135, 138 and 139, subsequent etching does not affect the layers underneath.

FIGS. 1T and 1U illustrates an application of the aforementioned concept thus far, as the photomask with the said technique applied for FIGS. 1T and 1U could be used for quadruple patterning. Referring to FIG. 1T, it shows two spacer loops of a first material 152a formed around a second spacer material 151a. The first spacer material 152a and the second spacer material 151a are respectively deposited on a first insulating material 153 in a trench formed in the second insulating material 150. 'A' indicates the cross section view along the cross section I-I. The slope of region A may be developed at a location with an intemiediate phase shift layer due to which a sloped profile may be formed. The intermediate phase shift layer may impart a 90 degree phase shift and 24.5% transmission. 'B' is the cross section view long the cross section II-II. The walls of region B tend to be straight, and the region B may be developed by the same photomask at a location with a standard phase shift layer of 180 degree phase shift and 6% transmission.

FIG. 1U illustrates the patterning after etching has been applied to FIG. 1T. For region A, the sloped sidewall produces a gap between the second insulating material 150 and the second spacer film 151b as only a part of the first spacer film 152b is etched away. The structure of region A in FIG. 1U is the similar to FIG. 1S. For region B, the straight edge produces the effect similar to FIG. 1R where the first spacer film 152b is completely etched away except for the remnant which was shielded by the second spacer film 151b. The purpose here is to expose the first insulating material 153 disposed underneath the first spacer film 152b. Wherever the first spacer film 152b is removed in region B, the first insulating material may be subsequently etched to form trenches be filled with metal. Thus for the pattern in FIG. 1U, at least four separate metal lines may be formed without having the end loops shorting the metal lines.

Figure 2A:
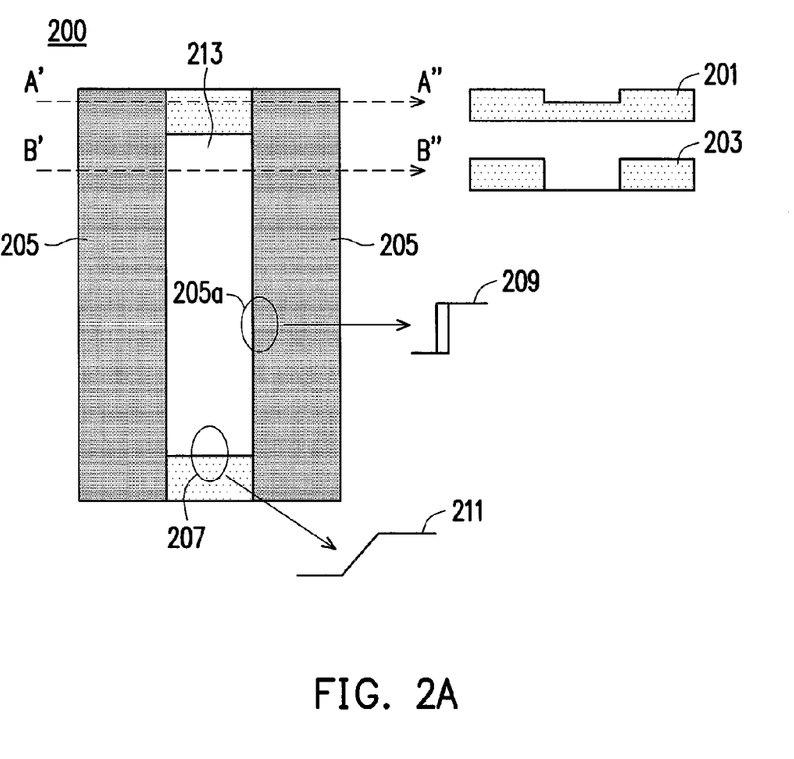
FIG. 2A illustrates an attenuated phase shift mask for double patterning according to one of the exemplary embodiments.
Figure 2B:
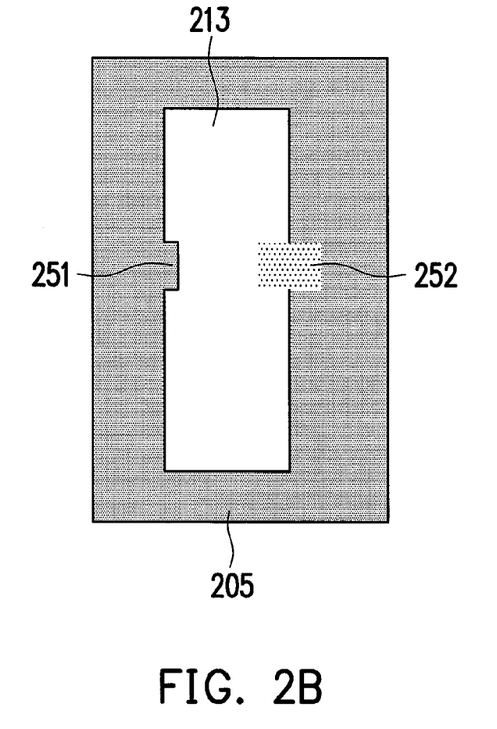
FIG. 2B illustrates an attenuated phase shift mask with a narrower clear region according to one of the exemplary embodiments.

FIGS. 2A and 2B illustrates the top view of an attenuated phase shift mask according to some exemplary embodiments. Similar to FIGS. 1A and 1B, the attenuated phase shift mask contains a transparent substrate with surfaces without any intentional recess or slope. The substrate may be bonded to a film or layer which would impart a phase shift and reduces transmission to the incident light. The phase shift layer could be etched to vary the rate of transmission and the phase shift angle of the incident light so as to develop loop breaking patterns in conjunction with fine spacer patterns as well as adjacent gaps or trenches, thus saving the steps of additional exposures. The clear region is preferably narrower when the clear region is adjacent to etched portions of the phase shift layer.

According to the top view of the exemplary attenuated phase shift mask as illustrated by FIG. 2A, there could be at least three regions. (The top view could also be the bottom view.) A phase shift layer which imparts a standard 6% transmission and 180 degrees phase constitutes an unetched region 205. The edge of the unetched region 205a would produce a photo resist pattern of a vertical wall 209. The unetched region 205 could be etched to form an etched region 207 or previously referred to as an intermediate phase region which would optimally impart a 90 degrees phase shift to the incident light and reduce the transmission to 24.5% and thus would produce a sloped sidewall 209 with a nearly horizontal slope at the foot of the sidewall. The transparent region in which the light does not go through any phase shift layer constitutes a clear region 213. The A'-A" cross section view shows the etched region located at the ends of the attenuated phase shift mask and surrounded by the unetched region on two opposite sides, and the etched region is adjacent to the clear region on one side. The B'-B" cross section view shows the clear region in between two unetched regions.

FIG. 2B illustrates another variation of the exemplary attenuated phase shift mask. According to FIG. 2B, the attenuated phase shift mask contains unetched region 205 and 251 and a clear region 213. However, FIG. 2B contains an unetched region 251 and a etched region 252 with a narrower clear region in between. Since the width of the clear region 213 adjacent to the regions 251 and 252 is narrower than when adjacent only to the unetched region 205, the effect of producing the sloped photoresist profile with an almost horizontal and rounding curvature at the foot of the slope is even more pronounced for the clear region is of narrower width.

The etched region does not have to have the exemplary 90 degree phase shift and 24.5% transmission in order to produce the desired effect as illustrated by FIGS. 1G, 1K, and 1S but parameters contain a tolerance. The phase shift for the etched region could be anywhere between 84 degrees and 97 degrees. The rate of transmission could be anywhere between and including 22 percent and 27 percent. Also the phase shift and the rate of transmission for the etched region does not have to be constant but can vary (e.g., a sloped sidewall profile) while producing an effective transmission and phase.

Figure 3A:
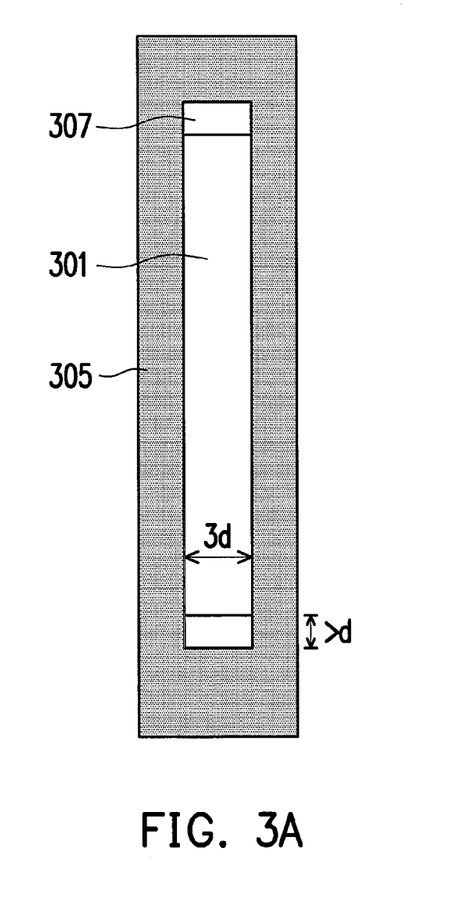
FIG. 3A illustrates an attenuated phase shift for double patterning according to one of the exemplary embodiments.

FIG. 3A illustrates applying the attenuated phase shift mask for double patterning according to one of the exemplary embodiments. The attenuated phase shift mask contains an unetched region 305 which produces a vertical side wall, an etched region 307 on both ends for the mask, and a clear region 301 situated in the center of the mask. The etched region 307 would produce a photoresist with a sloped profile which enables the subsequently deposited spacer material to removed in order the break the loop on both edges as previously explained for FIGS. 1H-IO. The width of the etched region for instance could be greater than or equal to d wide as shown in FIG. 3A, as d could represent a minimum half-pitch distance, multiplied by the photomask demagnification factor, typically 4. The width of clear region 301 could be 3d or 3 multiplies by d wide, which could represent 3 times the minimum half-pitch distance, as 3 line traces could be exposed under the clear region.

Figure 3B:
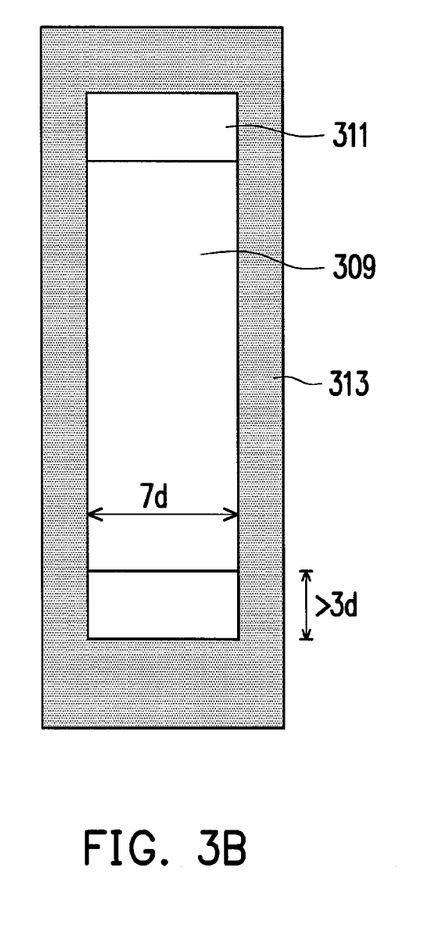
FIG. 3B illustrates an attenuated phase shift mask for quadruple patterning according to one of the exemplary embodiments.

FIG. 3B illustrates an attenuated phase shift mask for quadruple patterning according to one of the exemplary embodiments. The attenuated phase shift mask contains an unetched region 313 which imparts a standard 180 degree phase shift and an etched region 311 which imparts an intermediate phase shift. The attenuated phase shift mask in combination with the process described for FIGS. 1P to 1U allows loops to be broken on both ends of the pattern under the etched region 311. The width of the etched region 311 could be greater than or equal to 3d or 3 times d wide. The clear region 309 could be 7d or 7 multiplies by d wide, which could represent 7 times the minimum half-pitch distance (multiplied by the photomask demagnification factor), as 7 line traces could be exposed under the clear region.

Figure 4A:
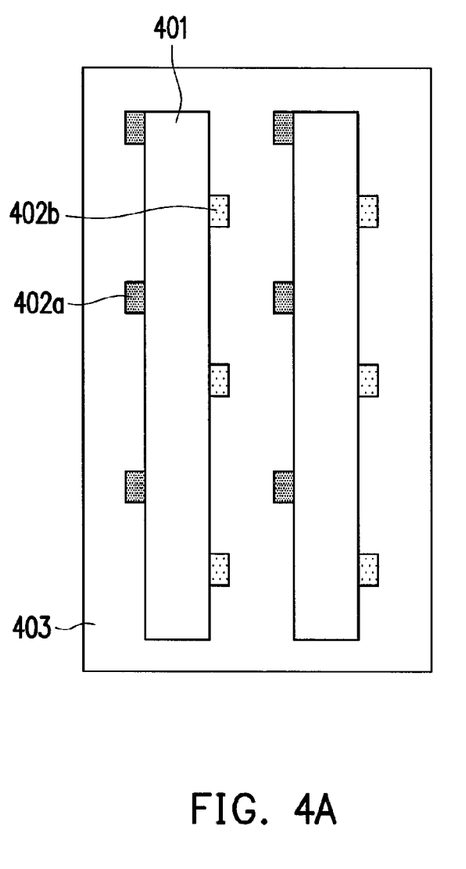
FIG. 4A illustrates a mask top view according to one of the exemplary embodiments.
Figure 4B:
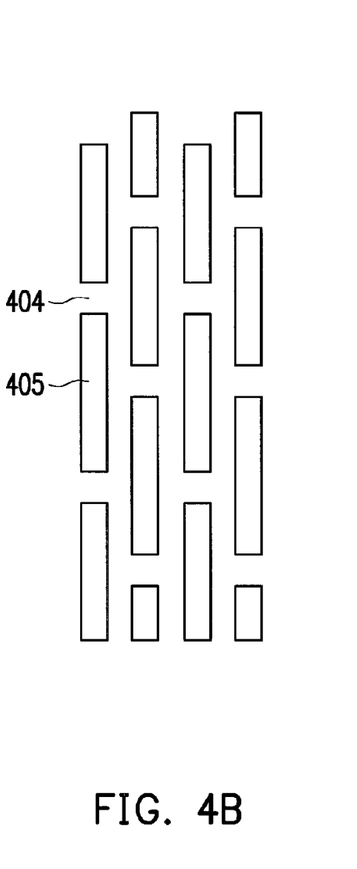
FIG. 4B illustrates a wafer pattern top view according to one of the exemplary embodiments.

FIGS. 4A-4B illustrate using an attenuated phase shift mask according to one of the exemplary embodiments for the application of patterning a DRAM active area layer. FIG. 4A illustrates the top view of the mask which contains a clear or fully transmitting region 401, an unetched region 403 with the standard 6% transmission and 180 degrees phase shift, and a plurality of etched regions 402a and 402b (only one of each is labeled). The etched region 402a could represent a first etched region, and 402b could represent a second etched region in which the transmission and the phase shift imparted by the second etched region 402b could be different from the first etched region 402a, so that the distance between 402a and 402b does not limit the resolution of the pattern, as it no longer defines a minimum pitch between identical features. For instance, the first etched region 402a could impart an about 24.5% transmission and a 90 degrees phase shift, and the second etched region 402b could impart a transmission and a phase shift greater or less than the first etched region 402a.

FIG. 4B illustrates the corresponding wafer pattern top view according to one of the exemplary embodiments using the same attenuated phase shift mask as FIG. 4A. The pattern of one of the lines 405 corresponds to the pattern produced by a spacer at the edge between the unetched mask region 403 and clear region 401, and the cut 404 corresponds to an etched region 402a or 402b as each etched mask region with an intermediate phase shift would produce a cut. The wafer pattern of FIG. 4B could be produced by only a single exposure.

In view of the aforementioned descriptions, the present disclosure provides an attenuated phase shift mask with at least one clear region, a etched phase shift region, and an unetched region which could under a single exposure provide the combination of fine spacer definition with structures for loop breaking and spacer cutting and thus saving at least one extra exposure process. Besides spacer patterning, the combination of sloped and straight feature profiles from the same photomask may also be used to control pattern transfer after directed self assembly (DSA) patterning using block copolymers. The sloped profile of the template guiding pattern may foil pattern transfer similar to the role of 135 or 150 in FIG. 1S or 1U, respectively.

It will be apparent to those skilled in the art that various modifications and variations can be made to the structure of the disclosed embodiments without departing from the scope or spirit of the disclosure. For example, it may be applied to reflective EUV masks, where reflection is substituted for transmission, and the mask substrate is a reflective multilayer rather than a transparent material. In view of the foregoing, it is intended that the disclosure cover modifications and variations of this disclosure provided they fall within the scope of the following claims and their equivalents.

What is claimed is:

1. An attenuated phase shift mask comprising:
   a substrate;
   a layer attached to the substrate for reducing transmission and imparting a phase shift to light transmitted through the layer, wherein the layer comprises:
     an etched region imparting a first phase shift and a first transmission;
     an unetched region imparting a second phase shift and a second transmission, wherein the first transmission is higher than the second transmission and the first phase shift is lower than the second phase shift; and
     a clear region adjacent to the etched region in at least one border and adjacent to the unetched region in another at least one border, wherein the clear region is surrounded by the etched region and the unetched region.

2. The attenuated phase shift mask according to claim 1, where the etched region of the layer includes a sloped profile.

3. The attenuated phase shift mask according to claim 1, wherein the first phase shift is between and including 84 degrees and 97 degrees.

4. The attenuated phase shift mask according to claim 1, wherein the first transmission is between and including 22 percent and 27 percent.

5. The attenuated phase shift mask according to claim 1, wherein the second phase shift is about 180 degrees.

6. The attenuated phase shift mask according to claim 1, wherein the second transmission is about 6 percent.

7. The attenuated phase shift mask according to claim 1, wherein the etched film region is surrounded mostly by the unetched film region.

8. The attenuated phase shift mask according to claim 1, wherein the clear region width is narrower when adjacent to the etched region than when adjacent to the unetched region.

9. The attenuated phase shift mask according to claim 1, wherein the light is obliquely incident at a specified angle.

10. The attenuated phase shift mask according to claim 1, wherein the substrate is a multilayer designed for reflecting extreme ultraviolet radiation.

11. An attenuated phase shift mask comprising:
    a substrate;
    a layer for reducing transmission and imparting a phase shift to light transmitted through the layer, wherein the layer comprises:
      a first etched region imparting a first phase shift and a first transmission;
      a second etched region imparting a second phase shift and a second transmission;
      an unetched region imparting a third phase shift and a third transmission; and
      a clear region surrounded by the unetched region, the first etched region, and the second etched region;
    wherein the first transmission and the second transmission are both greater than the third transmission, and the first phase shift and the second shift are both less than the third phase shift.

12. The attenuated phase shift mask according to claim 11, wherein either of the first etched region and the second etch region of said film include sloped profiles.

13. The attenuated phase shift mask according to claim 11, wherein the third phase shift is about 180 degrees.

14. The attenuated phase shift mask according to claim 11, wherein the third transmission is about 6 percent.

15. The attenuated phase shift mask according to claim 11, wherein the first phase shift is less than 90 degrees.

16. The attenuated phase shift mask according to claim 11, wherein the second phase shift is greater than 90 degrees.

17. The attenuated phase shift mask according to claim 11, wherein the first etched region and the second etched region are surrounded mostly by the unetched region.

18. The attenuated phase shift mask according to claim 11, wherein the clear region width is narrower when adjacent to the first or second etched region than when adjacent to the unetched region.

19. The attenuated phase shift mask according to claim 11, wherein the light is obliquely incident at a specified angle.

20. The attenuated phase shift mask according to claim 11, wherein the mask substrate is a multilayer designed for reflecting extreme ultraviolet radiation.

* * * * *